United States Patent
Rau et al.

(10) Patent No.: US 8,643,173 B1
(45) Date of Patent: Feb. 4, 2014

(54) COOLING APPARATUSES AND POWER ELECTRONICS MODULES WITH SINGLE-PHASE AND TWO-PHASE SURFACE ENHANCEMENT FEATURES

(71) Applicants: Toyota Motor Engineering & Manufacturing North America, Inc., Erlanger, KY (US); Purdue University, West Lafayette, IN (US)

(72) Inventors: Matthew Joseph Rau, Lafayette, IN (US); Ercan Mehmet Dede, Ann Arbor, MI (US); Shailesh N. Joshi, Ann Arbor, MI (US); Suresh V. Garimella, West Lafayette, IN (US)

(73) Assignees: Toyota Motor Engineering & Manufacturing North America, Inc., Erlanger, KY (US); Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 13/734,710

(22) Filed: Jan. 4, 2013

(51) Int. Cl.
*H01L 23/34* (2006.01)

(52) U.S. Cl.
USPC .......... 257/714; 257/E23.079; 257/774; 361/699; 361/718; 165/80.4

(58) Field of Classification Search
USPC ............ 257/E23.079, 619, 714, 774–776; 438/280, 619; 361/699–703, 718; 165/80.4, 80.5, 104.33, 908
See application file for complete search history.

(56) References Cited

U.S. PATENT DOCUMENTS

| | | | |
|---|---|---|---|
| 5,067,047 A | 11/1991 | Azar | |
| 5,548,907 A * | 8/1996 | Gourdine | 34/448 |
| 6,123,145 A | 9/2000 | Glezer et al. | |
| 6,349,554 B2 * | 2/2002 | Patel et al. | 62/259.2 |
| 6,952,346 B2 * | 10/2005 | Tilton et al. | 361/699 |
| 7,206,203 B2 * | 4/2007 | Campbell et al. | 361/699 |
| 7,233,494 B2 * | 6/2007 | Campbell et al. | 361/699 |

(Continued)

FOREIGN PATENT DOCUMENTS

WO 98/44307 10/1998

OTHER PUBLICATIONS http://digitalcommons.mcmaster.ca/cgi/viewcontent.cgi?article=7365&context=opendissertations; "Effect of surface finish on boiling heat transfer at stagnation point under free liquid jet impingement", 2011.

(Continued)

*Primary Examiner* — Chris Chu
(74) *Attorney, Agent, or Firm* — Dinsmore & Shohl LLP

(57) ABSTRACT

Jet-impingement, two-phase cooling apparatuses and power electronics modules having a target surface with single- and two-phase surface enhancement features are disclosed. In one embodiment, a cooling apparatus includes a jet plate surface and a target layer. The jet plate surface includes a jet orifice having a jet orifice geometry, wherein the jet orifice is configured to generate an impingement jet of a coolant fluid. The target layer has a target surface, single-phase surface enhancement features, and two-phase surface enhancement features. The target surface is configured to receive the impingement jet, and the single-phase surface enhancement features and the two-phase enhancement features are arranged on the target surface according to the jet orifice geometry. The single-phase surface enhancement features are positioned on the target surface at regions associated with high fluid velocity, and the two-phase surface enhancement features are positioned on the target surface at regions associated with low fluid velocity.

20 Claims, 5 Drawing Sheets

(56) References Cited

U.S. PATENT DOCUMENTS

| | | | |
|---|---|---|---|
| 7,277,283 | B2 | 10/2007 | Campbell et al. |
| 7,375,962 | B2* | 5/2008 | Campbell et al. ............. 361/699 |
| 7,514,046 | B2* | 4/2009 | Kechagia et al. ............. 422/504 |
| 7,639,030 | B2 | 12/2009 | Wadell |
| 7,762,314 | B2 | 7/2010 | Campbell et al. |
| 7,885,074 | B2 | 2/2011 | Campbell et al. |
| 7,916,483 | B2* | 3/2011 | Campbell et al. ............. 361/702 |
| 7,921,664 | B2 | 4/2011 | Rini et al. |
| 7,992,627 | B2 | 8/2011 | Bezama et al. |
| 8,077,460 | B1 | 12/2011 | Dede et al. |
| 8,266,802 | B2* | 9/2012 | Campbell et al. .......... 29/890.03 |
| 2005/0041393 | A1* | 2/2005 | Tustaniwskyi et al. ....... 361/699 |
| 2006/0162365 | A1* | 7/2006 | Hoang et al. ................. 62/259.2 |
| 2007/0119565 | A1 | 5/2007 | Brunschwiler et al. |
| 2010/0097760 | A1 | 4/2010 | Azar et al. |
| 2012/0170222 | A1 | 7/2012 | Dede |
| 2012/0212907 | A1 | 8/2012 | Dede |

OTHER PUBLICATIONS

Amon, Cristina H., S. C. Yao, C.F. Wu, and C. C. Hsieh. "Microelectromechanical System-Based Evaporative Thermal Management of High Heat Flux Electronics." Journal of Heat Transfer, 2005:66-75.

Brignoni, L., Garimella, S., "Performance Characteristics of Confined Impinging Air Jets with Surface Enhancement," Advances in Electronic Packaging, vol. 26-2, 1999: 2009-2014.

Brunschwiler, T., H. Rothuizen, M. Fabbri, U. Kloter, B. Michel, R.J. Benzama, and G. Natarajan. Direct Liquid Jet-Impingment Cooling With Micron-Sized Nozzle Array and Distributed Return Architecture. Proc. of the Tenth Intersociety Conference on Thermal and Thermomechanical Phenomena in Electronics Systems, San Diego, CA, 2006: 196-203.

El-Sheikh, H., Garimella, S., "Heat Transfer from Pin-Fin Heat Sinks under Multiple Impinging Jets," IEEE Transactions on Advanced Packaging, vol. 23-1, 2000: 113-120.

http://academiccommons.columbia.edu/catalog/ac%3A131465; "Micro-Evaporator Design and Investigation of Phase Change in Tailored Microchannels"; Selin Arslan; Graduate School of Arts and Sciences, Columbia University, 2011.

http://www.sciencedirect.com/science/article/pii/S0017931098003378; "An experimental study of slot jet impingement cooling on concave surface: effects of nozzle configuration and curvature", 1999.

https://engineering.purdue.edu/CTRC/research/projects/A_JetImpingement_oneslider2011.pdf; "Two-Phase Liquid Jet Impingement Cooling"; S. V. Garimella, D.A. West; Purdue University, Cooling Technologies Research Center.

https://www.lboro.ac.uk/research/iemrc/documents/EventsDocuments/3rd%20conference%202008/Presentations/opt%20cooling%20Skuriat%20notts.pdf; "Optimum Cooling Solutions for Power Electronics"; Robert Skuriat, Nottingham University, Jul. 4, 2008.

Lay, J. H., and V.K. Dhir. "Nucleate Boiling Heat Flux Enhancement on Macro/Micro-Structured Surfaces Cooled by an Impinging Jet." Journal of Enhanced Heat Transfer, 1995: 177-88.

Sung, M. K., Mudawar, I., "Single-phase and two-phase cooling using hybrid micro-channel/slot-jet module." Int. J. of Heat and Mass Transfer, 51, 2008: 3825-2839.

Wadsworth, D.C., Mudawar, I., "Cooling of a Multichip Electronic Module by Means of Confined Two-Dimensional jets of dielectric liquid," Transactions of the ASME Journal of Heat Transfer, vol. 112, 1990: 891-898.

* cited by examiner

COOLING APPARATUSES AND POWER ELECTRONICS MODULES WITH SINGLE-PHASE AND TWO-PHASE SURFACE ENHANCEMENT FEATURES

TECHNICAL FIELD

The present specification generally relates to cooling apparatuses for cooling heat generating devices and, more particularly, to jet impingement, two-phase cooling apparatuses having single- and two-phase surface enhancement features.

BACKGROUND

Heat generating devices, such as power semiconductor devices, may be coupled to a heat spreader to remove heat and lower the maximum operating temperature of the heat generating device. In some applications, cooling fluid may be used to receive heat generated by the heat generating device by convective thermal transfer, and remove such heat from the heat generating device. For example, jet impingement may be used to cool a heat generating device by directing impingement jets of coolant fluid onto the heat generating device or a target surface that is thermally coupled to the heat generating device. Additionally, jet impingement may also be combined with two-phase cooling, where the heat generating device is cooled by the phase change of the coolant fluid from a liquid to a vapor.

The coolant fluid flowing on the target surface may have regions of high fluid velocity, and regions of low fluid velocity. Coolant fluid flowing in the regions of high fluid velocity may not change phase to a vapor, but rather provide single-phase heat transfer, while coolant fluid flowing in the regions of low fluid velocity tends to boil and change to a vapor.

Accordingly, a need exists for alternative jet impingement, two-phase cooling apparatuses that take advantage of the high fluid velocity regions and the low fluid velocity regions of coolant flowing on a target surface after impingement.

SUMMARY

In one embodiment, a cooling apparatus includes a jet plate surface and a target layer. The jet plate surface includes a jet orifice having a jet orifice geometry, wherein the jet orifice generates an impingement jet of a coolant fluid. The target layer has a target surface, single-phase surface enhancement features, and two-phase surface enhancement features. The target surface is configured to receive the impingement jet, and the single-phase surface enhancement features and the two-phase enhancement features are arranged on the target surface according to the jet orifice geometry.

In another embodiment, a cooling apparatus includes a jet plate surface and a target layer. The jet plate surface includes a jet orifice that is configured to generate an impingement jet of a coolant fluid. The target layer includes a target surface, single-phase surface enhancement features, and two-phase surface enhancement features. The jet plate surface is offset from the target surface such that the target surface is configured to receive the impingement jet. The jet orifice has a geometry such that when the impingement jet impinges the target surface, a flow pattern of the coolant fluid is produced that is parallel to the target surface. The flow pattern includes regions of high fluid velocity and regions of low fluid velocity. The single-phase surface enhancement features are located at the regions of high fluid velocity, and the two-phase surface enhancement features are located at the regions of low fluid velocity.

In yet another embodiment, a power electronics module includes a jet plate surface, a target layer, and a semiconductor device thermally coupled to the heat transfer surface. The jet plate surface includes a jet orifice having a jet orifice geometry, wherein the jet orifice is configured to generate an impingement jet of a coolant fluid. The target layer includes a target surface, a heat transfer surface, single-phase surface enhancement features, and two-phase surface enhancement features. The target surface is configured to receive the impingement jet, and the single-phase surface enhancement features and the two-phase enhancement features are arranged on the target surface according to the jet orifice geometry.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to jet impingement, two-phase cooling apparatuses that may be utilized to cool heat generating devices, such as semiconductor devices. Jet impingement cooling is provided by directing jets of coolant fluid at an impingement region of a target surface, which may be a heat generating device or a thermally conductive surface coupled to the heat generating device. Heat is transferred to the coolant fluid. In two-phase heat transfer systems, the coolant fluid changes phase from a fluid to a vapor, thereby removing heat flux from the heat generating device. Embodiments described herein employ both single-phase and two-phase surface enhancement features that are arranged on a target surface according to a shape of a jet orifice that produces an impingement jet that strikes the target surface at an impingement region. More particularly, jet orifices of different shapes produce different flow patterns of coolant fluid. The flow patterns have regions of high fluid velocity where the coolant fluid flows relatively fast, and regions of low fluid velocity where the coolant fluid flows relatively slowly (i.e., slower than the regions of high fluid velocity). Two-phase heat transfer in the form of nucleate boiling of the coolant fluid may be more efficient at the regions of low fluid velocity (i.e., non-dominant flow regions), while single-phase heat transfer in the form of convection between the target layer and the coolant fluid may occur at the regions of high fluid velocity (i.e., dominant flow regions) with little nucleate boiling.

In embodiments of the present disclosure, single-phase surface enhancement features in the form of thermally conductive fins are strategically provided on the target surface at the regions of high fluid velocity to increase the surface area of the target surface, thereby increasing heat transfer from the target surface to the coolant fluid. In the regions of low fluid velocity, two-phase surface enhancement features are strategically placed to provide enhanced nucleate boiling surfaces for encouraging two-phase heat transfer. In this manner, embodiments include a target surface that provides for both single-phase and two-phase heat transfer on a single surface. The single-phase and two-phase surface enhancement features are arranged on the target surface according to the shape of the jet orifice to provide for optimum single-phase and two-phase heat transfer. Various embodiments of cooling apparatuses having single-phase and two-phase surface enhancement features on a target surface according to a shape of a jet orifice are described herein below.

Figure 1:
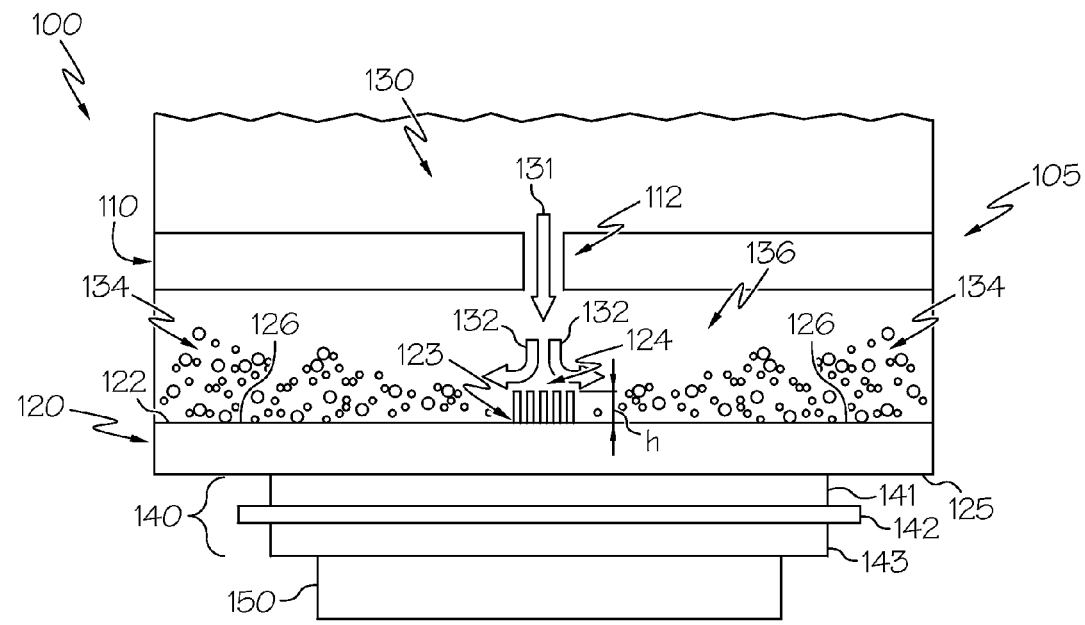
FIG. 1 schematically depicts a power electronics module comprising a jet orifice and a target surface with single-phase surface enhancement features and two-phase surface enhancement features according to one or more embodiments described and illustrated herein.

Referring now to FIG. 1, a power electronics module 100 comprising a cooling apparatus 105 coupled to a substrate assembly 140 and a semiconductor device 150 is schematically illustrated. Semiconductor devices may include, but are not limited to, insulated gate bipolar transistors (IGBT), metal-oxide-semiconductor field effect transistors (MOSFET), power diodes, power bipolar transistors, power thyristor devices, and the like. As an example and not a limitation, the semiconductor device may be included in a power electronic module as a component in an inverter and/or converter circuit used to electrically power high load devices, such as electric motors in electrified vehicles (e.g., hybrid vehicles, plug-in hybrid electric vehicles, plug-in electric vehicles, and the like). The cooling apparatuses described herein may also be used to cool heat generating devices other than semiconductor devices (e.g., mechanical devices, such as motors).

In the illustrated embodiment, the semiconductor device 150 is thermally coupled to an intermediate substrate assembly 140. The illustrated substrate assembly 140 comprises an insulating dielectric layer 142 disposed between two metal layers 141, 143. The substrate assembly 140 may comprise a direct bonded substrate assembly, such as a direct bonded copper assembly or a direct bonded aluminum assembly. Exemplary materials for the insulating dielectric layer 142 include, but are not limited to, alumina, aluminum nitride, silicon nitride, silicon carbide, and beryllium oxide. In alternative embodiments, only one metal layer may be provided. In yet other embodiments, the semiconductor device 150 is directly bonded the cooling apparatus (e.g., at a heat transfer surface 125 of the target layer 120).

The exemplary cooling apparatus 105 generally comprises a jet channel 130, a jet plate 110, and a target layer 120 that is offset from the jet plate 110. The jet plate 110 has at least one jet orifice 112. Coolant fluid (e.g., deionized fluid or an engineered fluid) flows into the jet channel 130 (e.g., via a fluid inlet (not shown)) and enters the jet orifice 112, as indicated by arrow 131. The coolant fluid flows through the jet orifice 112 as an impingement jet that impinges a target surface 122 of the target layer 120 at an impingement region 123. The target layer 120 is fabricated from a thermally conductive material, such as copper or aluminum, for example, and has a target surface 122 that receives the coolant fluid, and a heat transfer surface 125 that is coupled to either the substrate assembly 140 or the semiconductor device 150.

The impingement region 123 may be positioned at a hot spot created by the heat flux generated by the semiconductor device 150. After impinging the target surface 122, the coolant fluid changes direction from being normal to the target surface 122 to flowing parallel to the target surface 122 within an impingement chamber 136, as indicated by arrows 132. The coolant fluid flows across the target surface 122 in a flow pattern defined by regions of different fluid velocities. Heat generated by the semiconductor device 150 is transferred from the target layer 120 to the coolant fluid. In regions of relatively slow fluid flow, some of the coolant fluid will change phase from a liquid to a vapor by nucleation boiling, as indicated by vapor bubbles 134. In regions of dominant, fast fluid flow, much of the heat removal is by convection. The coolant fluid may be removed from the cooling apparatus 105 by outlet ports (not shown) located at the sides of the cooling apparatus 105, or at a top surface of the cooling apparatus 105.

The flow pattern is defined by the shape of the jet orifice 112. For example, a jet orifice 112 having a particular shape or geometry will produce a corresponding flow pattern, while a jet orifice 112 having a different shape or geometry from the aforementioned shape or geometry will produce a different flow pattern from the aforementioned flow pattern. The shape of the jet orifice 112 may depend on the temperature profile on the target surface 122 that is generated by the semiconductor device 150. The jet orifice 112 may take on a variety of shapes, including, but not limited to, cross-shaped (see FIG. 3), star-shaped, lobed-shaped (see FIG. 5), and helical.

Single-phase and two-phase surface enhancement features are provided on the target surface 122 to enhance both single-phase heat transfer and two phase heat transfer, respectively. As shown in FIG. 1 and described in more detail below, single-phase surface enhancement features 124 in the form of thermally conductive fins having a height h are positioned on the target surface 122 at regions associated with high fluid velocity (i.e., dominant fluid flow regions), and two-phase surface enhancement features 126 are positioned on the target surface 122 at regions associated with low fluid velocity (i.e., non-dominant fluid flow regions). The fluid flow velocity may be defined by the fluid flow rate, for example. The two-phase surface enhancement features 126 may be any surface features that increase the number of nucleation sites to promote boiling of the coolant fluid. Two-phase surface enhancement features 126 include, but are not limited to, a roughened target surface 122 (e.g., by laser damage, by chemical etching, by grinding, etc.), a thermally conductive film layer having micro- and/or nano-features that is applied to the target surface 122, micro- or nano-features fabricated into the target surface 122 (e.g., by lithography and chemical etching, laser fabrication, etc.), and a porous area (e.g., a porous coating) of the target surface 122. For example, the two-phase surface enhancement features 126 may be defined by micro-pillars that provide additional surface area to encourage nucleation. However, it should be understood that any surface that encourages nucleation may be used for the two-phase surface enhancement features 126.

Figure 2:
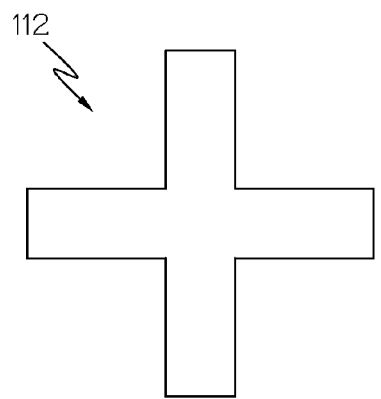
FIG. 2 schematically depicts a cross-shaped jet orifice according to one or more embodiments described and illustrated herein.
Figure 3:
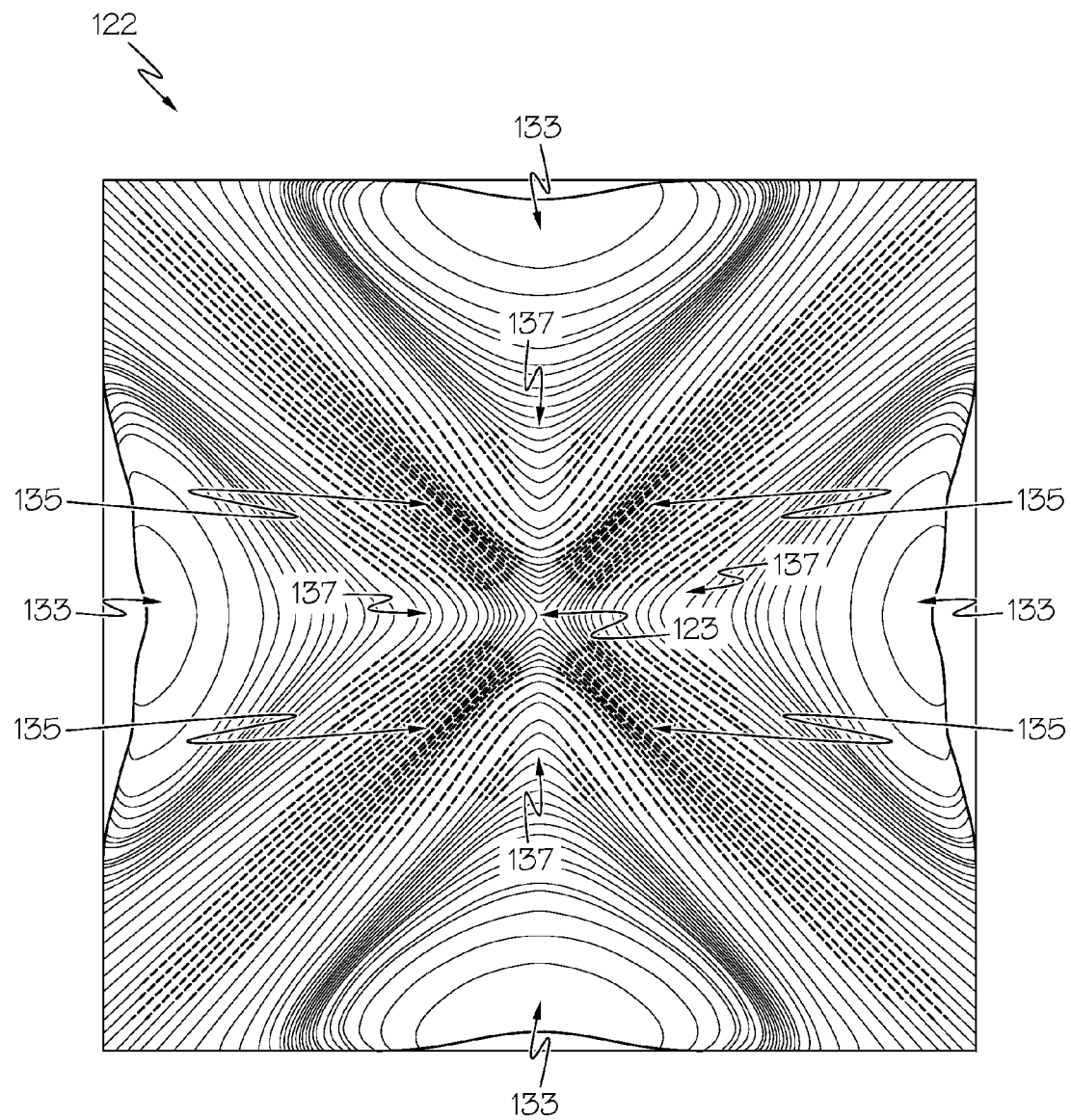
FIG. 3 schematically depicts a flow pattern of coolant fluid on a target surface corresponding to the jet orifice depicted in FIG. 2 according to one or more embodiments described and illustrated herein.

As described above, the jet orifice 112 may have a particular jet orifice geometry that produces a particular flow pattern on the target surface 122. FIG. 2 schematically depicts a cross-shaped jet orifice, while FIG. 3 schematically depicts fluid flow streamlines illustrating a computed flow pattern associated with the jet orifice depicted in FIG. 2. It should be understood that the cross-shaped jet orifice 112 and the flow pattern depicted in FIGS. 2 and 3 are for illustrative purposes only, and that other jet orifice geometries and resulting flow patterns are possible.

The impingement jet of coolant fluid strikes the impingement region 123 in a cross-shaped pattern having arm regions 137. As shown in FIG. 3, regions of high fluid velocity 135 radially extend from the center of the impingement region 123. The dashed fluid flow streamlines in the regions of high fluid velocity 135 represent high fluid velocity, while the solid fluid lines represent slower fluid velocity. The regions of high fluid velocity 135 in the illustrative flow pattern are at forty-five degree angles with respect to the cross-shaped jet orifice 112. The coolant fluid within the regions of high fluid velocity 135 represent the dominant fluid flow on the target surface 122. The coolant fluid flowing parallel to the jet orifice 112 within the arm regions 137 from the impingement region 123 has a fluid velocity that is lower than the coolant fluid flowing at an angle with respect to the arm regions 137. The coolant fluid flowing parallel to the jet orifice within the arm regions 137 flow into regions of low fluid velocity 133 and represent a non-dominant fluid flow on the target surface 122.

The regions of high fluid velocity 135 may be created by the coolant fluid impinging the target surface in a cross-shaped impingement jet, where coolant fluid from the arms of the impingement jet are forced outwardly upon impingement on the target surface 122, and is combined into high velocity fluid flows that are at a forty-five degree angle with respect to the cross-shaped impingement jet flowing through the cross-shaped jet orifice 112.

Figure 4:
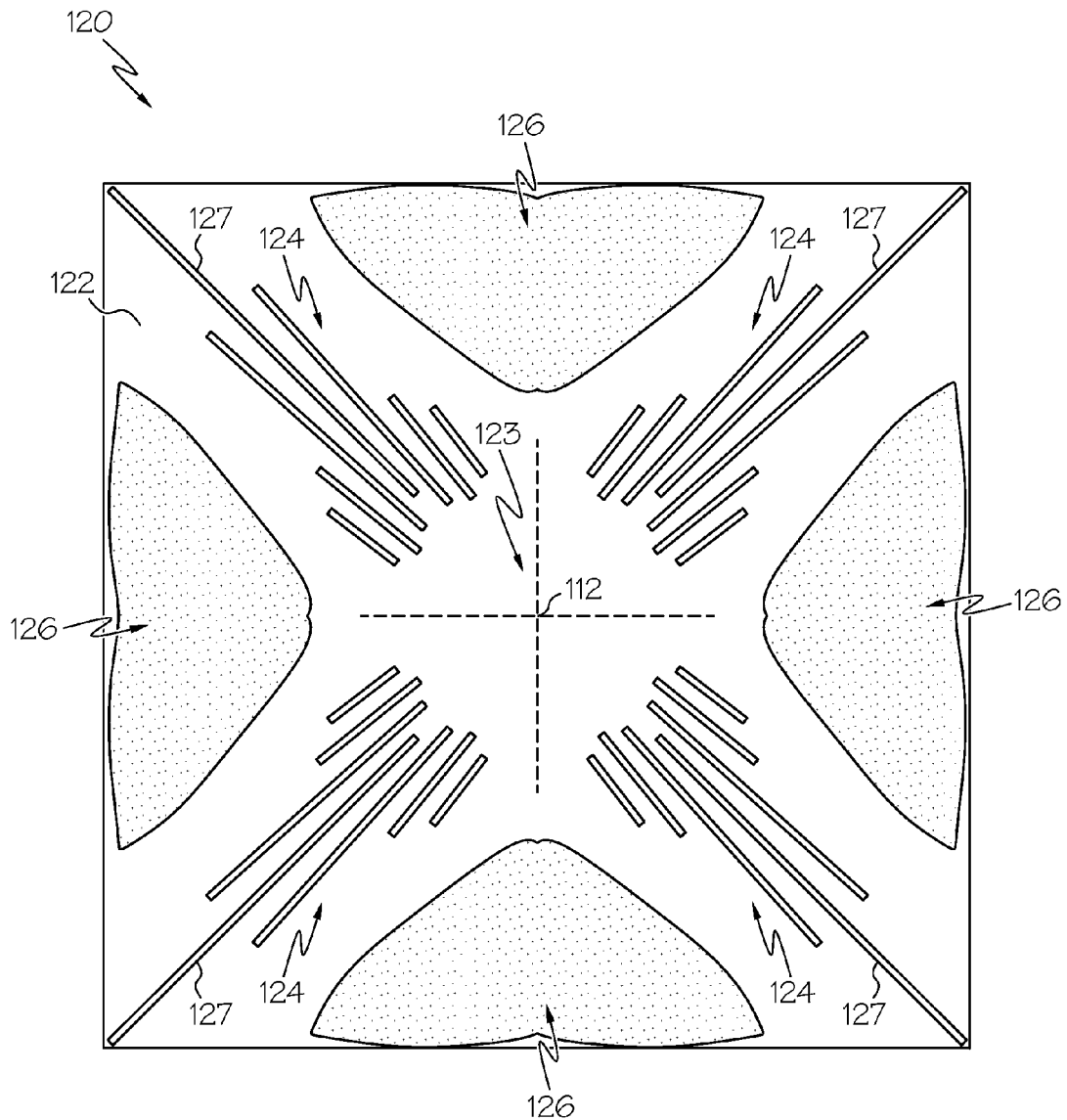
FIG. 4 schematically depicts a target surface having single-phase surface enhancement features and two-phase surface enhancement features arranged according to the flow pattern depicted in FIG. 3 according to one or more embodiments described and illustrated herein.

As stated above, embodiments of the present disclosure comprise a target surface 122 having strategically positioned single-phase surface enhancement features and two-phase surface enhancement features. Referring now to FIG. 4, a target surface 122 of a target layer 120 is schematically depicted. Single-phase surface enhancement features 124 are located at the regions of high fluid velocity 135, and two-phase surface enhancement features 126 are located at the regions of low fluid velocity 133. As shown in FIG. 4, the single-phase surface enhancement features 124 are configured as thermally conductive fins that radially extend from the impingement region 123. The jet orifice 112 is depicted in dashed lines for reference. The thermally conductive fins may be integral to the target surface 122 of the target layer 120, or discrete components that are bonded or otherwise coupled to the target surface 122. The single-phase surface enhancement features 124 increase the surface area of the target surface 122 that the coolant fluid is in contact with, thereby enhancing thermal transfer from the target surface 122 to the coolant fluid by convection.

In the illustrated embodiment, the single-phase surface enhancement features 124 are arranged in four groups that correspond to the four regions of high fluid velocity 135 depicted in FIG. 3. The single-phase surface enhancement features 124 within each group may be optimally shaped and arranged to optimize coolant fluid flow and convection. In the non-limiting illustrated example, a center single-phase surface enhancement feature (or center thermally conductive fin 127) of each group may be configured as the longest thermally conductive fin, with each thermally conductive fin being shorter than the previous thermally conductive fin in directions away from the center thermally conductive fin 127. In this manner, the single-phase surface enhancement features 124 may be arranged to match the shape of the regions of high fluid velocity 135 depicted in FIG. 3. However, it should be understood that embodiments are not limited to the arrangement of single-phase surface enhancement features 124 depicted in FIG. 4, and that other arrangements are also possible.

Similarly, the two-phase surface enhancement features 126 are arranged at the regions of low fluid velocity 133 of the coolant fluid as shown in FIG. 3. The two-phase surface enhancement features 126 may be any micro- or nano-scale features that act as nucleation site enhancements to promote nucleation of the coolant fluid. As an example and not a limitation, the two-phase surface enhancement features 126 may be provided by roughening the target surface 122 such that the area of the two-phase surface enhancement features 126 has a surface roughness (measured in root-mean-squared ("RMS")) that is greater than the surface roughness of areas of the target surface that are outside of the area of the two-phase surface enhancement features 126. In the illustrated embodiment, the two-phase surface enhancement features 126 are located near the perimeter of the target surface 122.

Because the outflow of the coolant fluid is not strong in the regions of low fluid velocity 133, nucleate boiling occurs at these areas of the target surface 122. The two-phase surface enhancement features 126 are configured such that nucleate boiling is enhanced compared to a smoother surface. Therefore, two-phase heat transfer is promoted at the regions of low fluid velocity 133 by the two-phase surface enhancement features 126.

In some embodiments, two-phase surface enhancement features may also be provided at the impingement region 123 because the heat flux being removed from the target layer 120 may be highest at the impingement region 123. The two-phase surface enhancement features may promote nucleate boiling at the impingement region 123 even though the velocity of the coolant fluid may be greater at the impingement region 123 than the other regions of low fluid velocity 133 because of the high temperature of the target surface 122.

In the illustrated embodiment, the groups of single-phase surface enhancement features 124 and the two-phase surface enhancement features 126 alternate about the impingement region 123 such that single-phase surface enhancement features 124 and the two-phase surface enhancement features 126 are symmetrical about more than one axis. As stated above, the arrangement of the single-phase and two-phase surface enhancement features 124, 126 correspond to the shape of the flow pattern, which corresponds to the shape of the jet orifice 112. In this manner, embodiments of the present disclosure encourage both single- and two-phase heat transfer on a single surface by the use of surface enhancement features.

The target surface 122 and surface enhancement features may be designed by first evaluating a temperature profile of the target surface 122 and the semiconductor device 150 (or other heat generating device). A desirable jet orifice 112 geometry may be designed by experimentally or computationally obtaining single-phase heat transfer results associated with a variety of jet orifice geometries. The geometry providing the best single-phase heat transfer results may be selected as the geometry for the jet orifice 112. The flow pattern of the coolant fluid resulting from the jet orifice 112 having the selected geometry (e.g., the flow pattern depicted in FIG. 3 resulting from the jet orifice 112 depicted in FIG. 2) may be evaluated such that the single-phase surface enhancement features 124 and the two-phase surface enhancement features 126 may be designed to complement to jet orifice geometry to maximize the cooling capabilities of the cooling apparatus 105.

Figure 5:
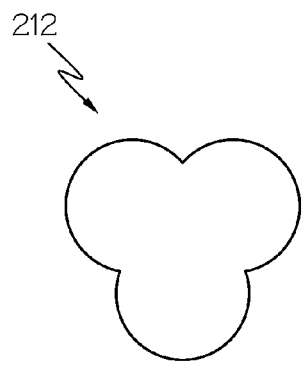
FIG. 5 schematically depicts a three-lobed jet orifice according to one or more embodiments described and illustrated herein.
Figure 6:
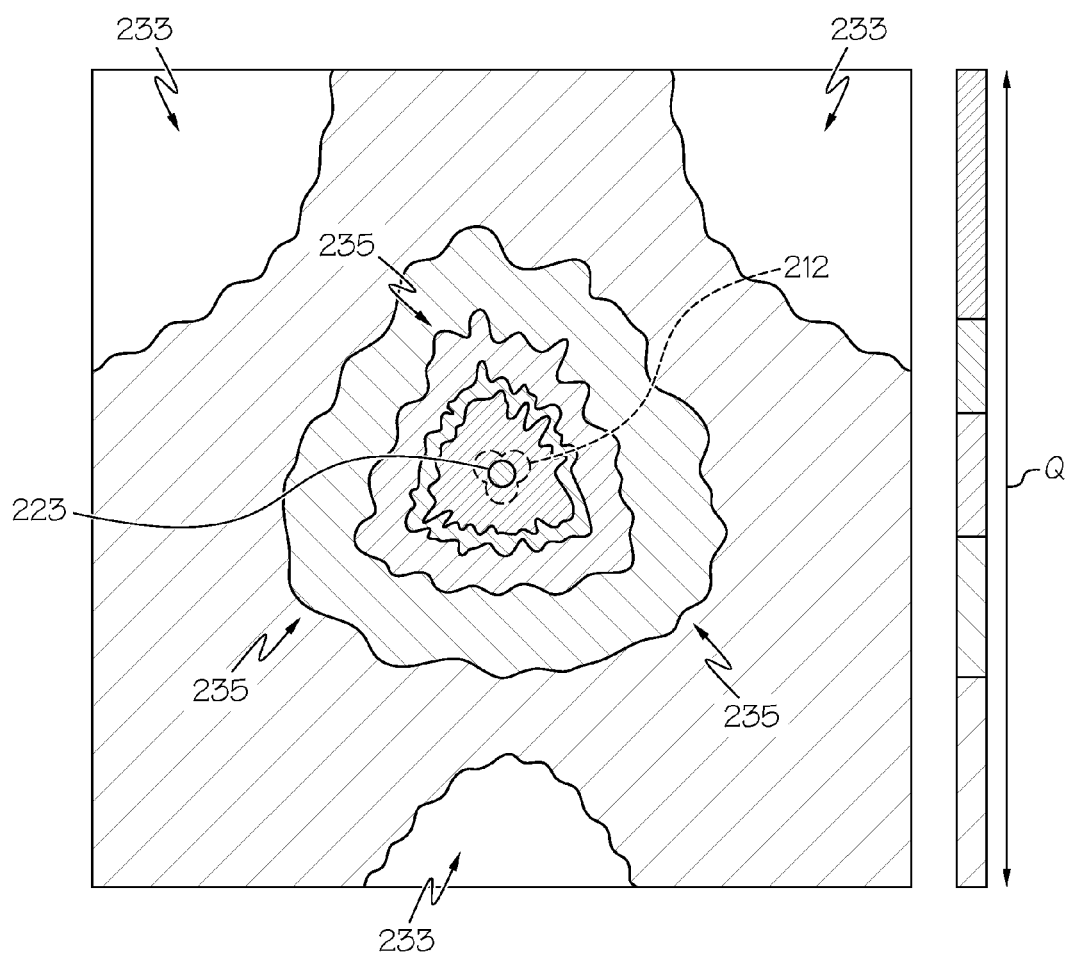
FIG. 6 schematically depicts a flow pattern of coolant fluid on a target surface corresponding to the jet orifice depicted in FIG. 5 according to one or more embodiments described and illustrated herein.

There are many possible jet orifice geometries and, therefore, many possible flow patterns. As another non-limiting example, FIGS. 5 and 6 depict a jet orifice 212 having a tri-lobed geometry and a resulting computationally derived flow pattern, respectively. The location of the jet orifice 212 with respect to the target surface is depicted in FIG. 6 by dashed lines for illustrative purposes. The flow pattern of FIG. 6 is represented by fluid flow velocity contours. The jet orifice 212 has three overlapping, circular lobes. Such a geometry may produce a desirable flow pattern to effectively cool a semiconductor device and target layer having a particular temperature profile.

As shown in FIG. 6, the velocity of the fluid is highest surrounding the impingement region 223, thereby providing a region of high fluid velocity. The velocity of the coolant fluid then decreases outwardly from impingement region 233. The flow of coolant fluid significantly slows or stops at the regions of low fluid velocity 233. Accordingly, the flow pattern resulting from the jet orifice 212 depicted in FIG. 5 has regions of high and low fluid velocity. The flow pattern of FIG. 6 is different from the flow pattern of FIG. 3 associated with the cross-shaped jet orifice 112 because of the difference in jet orifice geometry.

Figure 7:
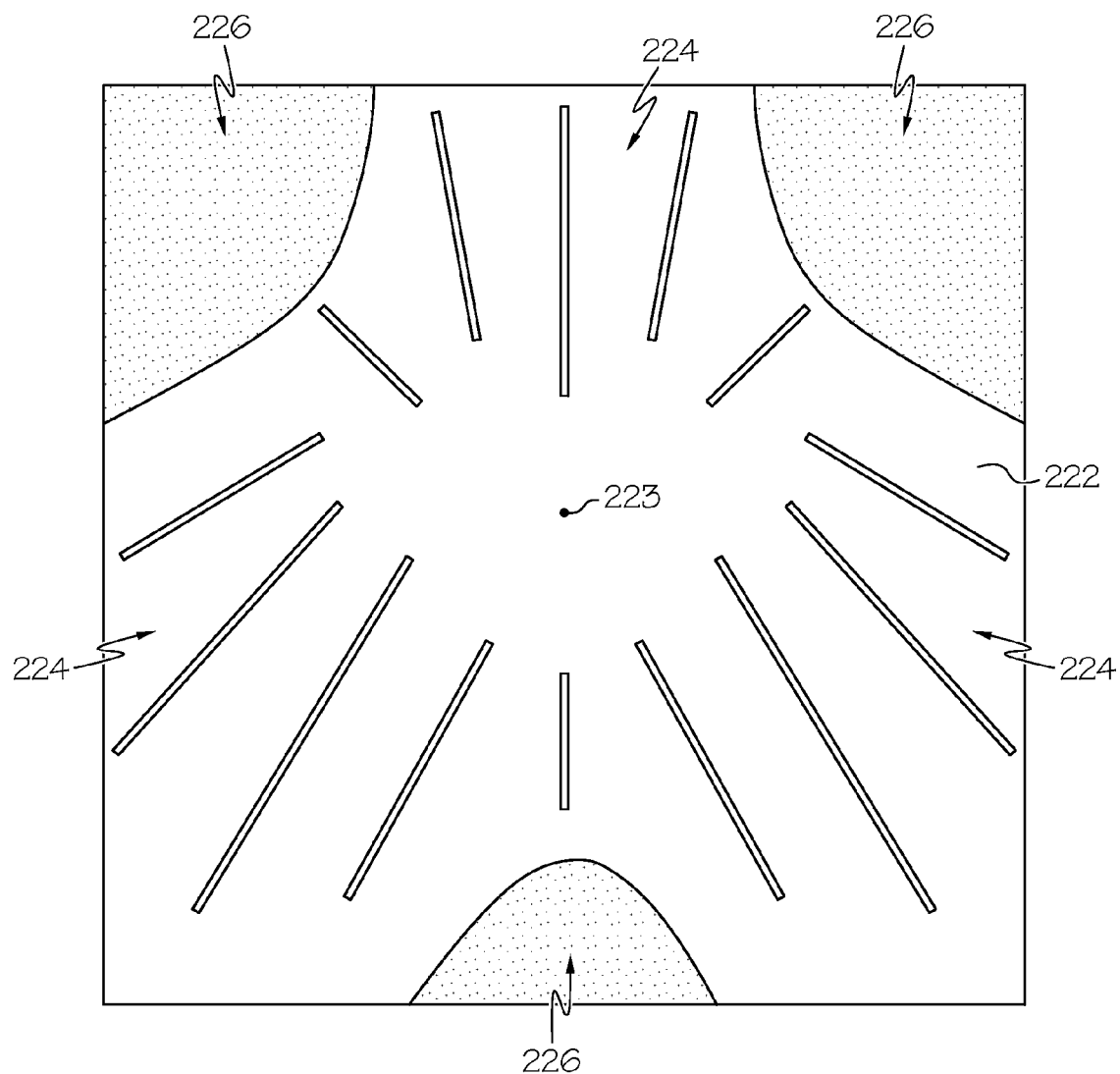
FIG. 7 schematically depicts a target surface having single-phase surface enhancement features and two-phase surface enhancement features arranged according to the flow pattern depicted in FIG. 6 according to one or more embodiments described and illustrated herein.

Referring now to FIG. 7, an exemplary target surface 222 corresponding to the flow pattern depicted in FIG. 6 is schematically illustrated. It should be understood that embodiments are not limited to the target surface 222 and corresponding single-phase and two-phase surface enhancement features depicted in FIG. 7. As described above with respect to FIG. 6, single-phase surface enhancement features 224 configured as thermally conductive fins are provided on the target surface 222 in the region of high fluid velocity 235. The thermally conductive fins may be integral to the target surface 222 of the target layer, or discrete components that are bonded or otherwise coupled to the target surface 222. The single-phase surface enhancement features 224 increase the surface area of the target surface 222 that the coolant fluid is in contact with, thereby enhancing thermal transfer from the target surface 222 to the coolant fluid by convection. In the illustrated embodiment, the single-phase surface enhancement features 224 are symmetrical about a single axis. More or fewer single-phase surface enhancement features 224 may be present on the target surface 222.

Similarly, the two-phase surface enhancement features 226 are arranged at the regions of low fluid velocity 233 of the coolant fluid as shown in FIG. 6. In the illustrated embodiment, there are three areas of two-phase surface enhancement features 226 that correspond with the three regions of low fluid velocity 233 of the flow pattern. As described above with reference to FIG. 4, the two-phase surface enhancement features 226 may be any micro- or nano-scale features that act as nucleation site enhancements to promote nucleation of the coolant fluid.

Because the outflow of the coolant fluid is not strong in the regions of low fluid velocity 233, nucleate boiling occurs at these areas of the target surface 222. The two-phase surface enhancement features 226 are configured such that nucleate boiling is enhanced compared to a smoother surface. In this manner, two-phase heat transfer is promoted at the regions of low fluid velocity 233 by the two-phase surface enhancement features 226. In some embodiments, two-phase surface enhancement features may also be provided at the impingement region 223 because the heat flux being removed from the target layer 220 may be highest at the impingement region 223. For example, two phase surface enhancement features may be provided on the target surface 222 in the central area surrounded by the single-phase surface enhancement features 224. In this manner, the embodiment depicted in FIG. 7 encourages both single- and two-phase heat transfer on a single surface by the use of surface enhancement features.

It should now be understood that embodiments described herein are directed to jet impingement, two-phase cooling assemblies and power electronics modules having a jet orifice with a shape tailored to a temperature profile of a target layer, and a target surface having single-phase surface enhancement features and two-phase surface enhancement features that are arranged corresponding to a flow pattern of coolant fluid produced by the jet orifice. The single-phase surface enhancement features are located on the target surface in regions of high fluid velocity to promote single-phase heat transfer to the coolant fluid, while the two-phase surface enhancement features are located on the target surface in regions of low fluid velocity to encourage nucleation and two-phase heat transfer.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A cooling apparatus comprising:
a jet plate surface comprising a jet orifice having a jet orifice geometry, wherein the jet orifice is configured to generate an impingement jet of a coolant fluid; and
a target layer comprising a target surface, single-phase surface enhancement features, and two-phase surface enhancement features, wherein the target surface is configured to receive the impingement jet, and the single-phase surface enhancement features and the two-phase enhancement features are arranged on the target surface according to the jet orifice geometry.

2. The cooling apparatus of claim 1, wherein:
the single-phase surface enhancement features are positioned on the target surface at regions associated with high fluid velocity of the coolant fluid;
the two-phase surface enhancement features are positioned on the target surface at regions associated with low fluid velocity of the coolant fluid; and
a fluid velocity of the coolant fluid at the regions associated with high fluid velocity is greater than a fluid velocity of the coolant fluid at the regions associated with low fluid velocity.

3. The cooling apparatus of claim 1, wherein the jet orifice is cross-shaped.

4. The cooling apparatus of claim 1, wherein the jet orifice has three circular lobes.

5. The cooling apparatus of claim 1, wherein the two-phase surface enhancement features comprise one or more porous coatings.

6. The cooling apparatus of claim 1, wherein the single-phase surface enhancement features comprise thermally conductive fins radially extending from an impingement region of the target surface.

7. The cooling apparatus of claim 6, wherein the two-phase surface enhancement features are further provided at the impingement region of the target surface.

8. The cooling apparatus of claim 1, wherein an arrangement of the single-phase surface enhancement features is such that the single-phase surface enhancement features are symmetrical about more than one axis.

9. The cooling apparatus of claim 1, wherein an arrangement of the single-phase surface enhancement features is such that the single-phase surface enhancement features are symmetrical about only one axis.

10. The cooling apparatus of claim 1, wherein:
the jet orifice is cross-shaped;
the single-phase surface enhancement features are arranged in groups of single-phase surface enhancement features; and
the groups of single-phase surface enhancement features and the two-phase enhancement features alternate about an impingement region of the target surface.

11. The cooling apparatus of claim 1, wherein the single-phase surface enhancement features are closer to an impingement region of the target surface than the two-phase surface enhancement features.

12. The cooling apparatus of claim 1, wherein:
the jet orifice is cross-shaped;
the single-phase surface enhancement features are arranged in groups of single-phase surface enhancement features; and
the groups of single-phase surface enhancement features and the two-phase enhancement features alternate about an impingement region of the target surface.

13. A cooling apparatus comprising:
a jet plate surface comprising a jet orifice configured to generate an impingement jet of a coolant fluid; and
a target layer comprising a target surface, single-phase surface enhancement features, and two-phase surface enhancement features, wherein:
the jet plate surface is offset from the target surface;
the target surface is configured to receive the impingement jet;
the jet orifice has a geometry such that when the impingement jet impinges the target surface, a flow pattern of the coolant fluid is produced that is parallel to the target surface and comprises regions of high fluid velocity and regions of low fluid velocity such that a fluid velocity of the coolant fluid in the regions of high fluid velocity is greater than a fluid velocity of the coolant fluid in the regions of low fluid velocity;
the single-phase surface enhancement features are located at the regions of high fluid velocity; and
the two-phase surface enhancement features are located at the regions of low fluid velocity.

14. The cooling apparatus of claim 13, wherein the jet orifice is cross-shaped.

15. The cooling apparatus of claim 13, wherein the jet orifice has three circular lobes.

16. The cooling apparatus of claim 13, wherein the two-phase surface enhancement features have a surface roughness that is greater than a surface roughness of regions of the target surface that are outside of the two-phase surface enhancement features.

17. The cooling apparatus of claim 13, wherein the single-phase surface enhancement features comprise thermally conductive fins radially extending from an impingement region of the target surface.

18. The cooling apparatus of claim 13, wherein an arrangement of the single-phase surface enhancement features is such that the single-phase surface enhancement features are symmetrical about only one axis.

19. A power electronics module comprising:
a jet plate surface comprising a jet orifice having a jet orifice geometry, wherein the jet orifice is configured to generate an impingement jet of a coolant fluid; and
a target layer comprising a target surface, a heat transfer surface, single-phase surface enhancement features, and two-phase surface enhancement features, wherein the target surface is configured to receive the impingement jet, and the single-phase surface enhancement features and the two-phase enhancement features are arranged on the target surface according to the jet orifice geometry; and
a semiconductor device thermally coupled to the heat transfer surface.

20. The power electronics module of claim 19, wherein:
the single-phase surface enhancement features are positioned on the target surface at regions associated with high fluid velocity of the coolant fluid;
the two-phase surface enhancement features are positioned on the target surface at regions associated with low fluid velocity of the coolant fluid; and
a fluid velocity of the coolant fluid at the regions associated with high fluid velocity is greater than a fluid velocity of the coolant fluid at the regions associated with low fluid velocity.

* * * * *